US008019386B2

(12) United States Patent
Dunn et al.

(10) Patent No.: US 8,019,386 B2
(45) Date of Patent: Sep. 13, 2011

(54) COMPANION MICROPHONE SYSTEM AND METHOD

(75) Inventors: William F. Dunn, Austin, TX (US); Mead C. Killion, Elk Grove Village, IL (US); Andrew J. Haapapuro, Arlington Heights, IL (US); Viorel Drambarean, Skokie, IL (US)

(73) Assignee: Etymotic Research, Inc., Elk Grove Village, IL (US)

( * ) Notice: Subject to any disclaimer, the term of this patent is extended or adjusted under 35 U.S.C. 154(b) by 1927 days.

(21) Appl. No.: 11/074,275

(22) Filed: Mar. 7, 2005

(65) Prior Publication Data

US 2005/0195996 A1 Sep. 8, 2005

Related U.S. Application Data

(60) Provisional application No. 60/550,419, filed on Mar. 5, 2004.

(51) Int. Cl.
*H04B 1/38* (2006.01)
*H04M 1/00* (2006.01)

(52) U.S. Cl. ...... 455/563; 455/90.2; 455/11.1; 455/500; 455/526; 455/103; 455/132; 455/135; 381/312; 381/122; 381/92; 381/313; 381/355; 704/205; 704/208

(58) Field of Classification Search .................. 455/563, 455/103, 132, 135, 90.2, 500, 526; 704/205, 704/208; 381/92, 93, 312, 313, 321, 322, 381/356

See application file for complete search history.

(56) References Cited

U.S. PATENT DOCUMENTS

| 4,837,833 | A | * | 6/1989 | Madaffari | 381/322 |
|---|---|---|---|---|---|
| 5,287,547 | A | | 2/1994 | Hidaka | |
| 5,410,608 | A | * | 4/1995 | Lucey et al. | 381/360 |
| 5,724,433 | A | * | 3/1998 | Engebretson et al. | 381/106 |
| 5,727,070 | A | * | 3/1998 | Coninx | 381/321 |
| 5,825,897 | A | * | 10/1998 | Andrea et al. | 381/71.6 |
| 5,966,639 | A | * | 10/1999 | Goldberg et al. | 455/11.1 |
| 5,995,599 | A | * | 11/1999 | Dunn et al. | 379/93.37 |
| 6,031,922 | A | * | 2/2000 | Tibbetts | 381/313 |
| 6,134,334 | A | * | 10/2000 | Killion et al. | 381/356 |

(Continued)

FOREIGN PATENT DOCUMENTS

EP 0 457 492 A2 11/1991

(Continued)

OTHER PUBLICATIONS

Supplementary European Search Report—Application No. EP 05 72 4953; The Hague, Jan. 12, 2010.

(Continued)

*Primary Examiner* — Marceau Milord
(74) *Attorney, Agent, or Firm* — McAndrews, Held & Malloy, Ltd.

(57) ABSTRACT

A method and system for enhancing speech intelligibility using wireless communication in portable, battery-powered and entirely user-supportable devices. The devices may be talker devices and receiver devices, where the audio signals input into the talker devices may be transmitted to the receiver devices to provide better quality audio to person using the receiver devices. The receiver devices may initiate and terminate communications with the talker devices. Additionally, the receiver devices may indicate to the talker devices the gain level the talker devices need to apply to the audio signals before sending them to the receiver devices.

29 Claims, 9 Drawing Sheets

U.S. PATENT DOCUMENTS

| | | | |
|---|---|---|---|
| 6,424,721 B1* | 7/2002 | Hohn | 381/313 |
| 6,529,606 B1* | 3/2003 | Jackson et al. | 381/71.4 |
| 6,704,423 B2* | 3/2004 | Anderson et al. | 381/313 |
| 6,707,920 B2* | 3/2004 | Miller | 381/326 |
| 6,798,890 B2* | 9/2004 | Killion et al. | 381/313 |
| 6,813,490 B1* | 11/2004 | Lang et al. | 455/414.1 |
| 6,831,987 B2* | 12/2004 | Killion et al. | 381/313 |
| 6,912,501 B2* | 6/2005 | Vaudrey et al. | 704/500 |
| 6,937,738 B2* | 8/2005 | Armstrong et al. | 381/312 |
| 6,944,474 B2* | 9/2005 | Rader et al. | 455/550.1 |
| 7,065,224 B2* | 6/2006 | Cornelius et al. | 381/369 |
| 7,068,797 B2* | 6/2006 | Isberg et al. | 381/92 |
| 7,072,480 B2* | 7/2006 | Rass | 381/314 |
| 7,072,482 B2* | 7/2006 | Van Doorn et al. | 381/355 |
| 7,076,076 B2* | 7/2006 | Bauman | 381/328 |
| 7,110,562 B1* | 9/2006 | Feeley et al. | 381/322 |
| 7,136,497 B2* | 11/2006 | McSwiggen | 381/313 |
| 7,245,733 B2* | 7/2007 | Saltykov | 381/322 |
| 7,248,711 B2* | 7/2007 | Allegro et al. | 381/316 |
| 7,292,876 B2* | 11/2007 | Bosch et al. | 455/556.1 |
| 7,313,246 B2* | 12/2007 | Miller et al. | 381/381 |
| 7,369,669 B2* | 5/2008 | Hagen et al. | 381/313 |
| 7,460,677 B1* | 12/2008 | Soede et al. | 381/92 |
| 7,492,914 B2* | 2/2009 | Arvidsson | 381/92 |
| 7,529,545 B2* | 5/2009 | Rader et al. | 455/432.2 |
| 7,551,894 B2* | 6/2009 | Gerber et al. | 455/41.2 |
| 7,684,572 B2* | 3/2010 | Ito | 381/119 |
| 7,787,647 B2* | 8/2010 | Hagen et al. | 381/314 |
| 2002/0039424 A1 | 4/2002 | Watanuki | |
| 2002/0068610 A1 | 6/2002 | Anvekar et al. | |
| 2002/0072816 A1 | 6/2002 | Shdema et al. | |
| 2002/0172162 A1 | 11/2002 | Goodings | |
| 2003/0045283 A1 | 3/2003 | Hagedoorn | |
| 2003/0223604 A1 | 12/2003 | Nakagawa | |
| 2004/0247138 A1 | 12/2004 | Wang | |

FOREIGN PATENT DOCUMENTS

| | | |
|---|---|---|
| EP | 1 377 118 A2 | 1/2004 |
| WO | WO 00/52959 A1 | 9/2000 |
| WO | 00/70811 | 11/2000 |
| WO | WO 01/52597 A1 | 7/2001 |
| WO | WO 2004/093490 A1 | 10/2004 |
| WO | 2004/110099 | 12/2004 |

OTHER PUBLICATIONS

Bluetooth Audio Video Working Group, Audio/Video Remote Control Profile, Version 1.0 Adopted, Internet Citation, May 22, 2003.

International Search Report and Written Opinion corresponding to International Patent Application No. PCT/US2009/069831 dated Jul. 2, 2010.

Sanz et al., "Performance of concatenated channel coding schemes with block repetition for a wireless indoor high bit rate flexible modem." 2001 12th IEEE International Symposium on Personal Indoor and Mobile Radio Communications, Sep. 30, 2001, XP002577033.

* cited by examiner

COMPANION MICROPHONE SYSTEM AND METHOD

RELATED APPLICATIONS

This patent application makes reference to, claims priority to and claims benefit from U.S. Provisional Patent Application Ser. No. 60/550,419, entitled "Companion Microphone System and Method," filed on Mar. 5, 2004, the complete subject matter of which is hereby incorporated herein by reference, in its entirety.

This patent application makes reference to U.S. Pat. No. 5,966,639, entitled "System and Method for Enhancing Speech Intelligibility of Multiple Talkers Utilizing Wireless Communication," issued on Oct. 12, 1999, the complete subject matter of which is hereby incorporated herein by reference, in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Hearing-impaired people often have difficulty comprehending speech in noisy and/or reverberant environments such as encountered at parties or in a restaurant. The hearing-impaired person may have difficulty comprehending the speech of the talkers due to: 1) a hearing aid that may not adequately correct for the loss of hearing sensitivity to quiet sounds, or 2) a residual hearing acuity that is inadequate to permit that person to understand speech in the presence of noise levels that normal-hearing individuals find acceptable for carrying on a conversation. The first problem, lack of adequate audibility at some frequencies, can often be corrected with readjustment or change in the hearing aid circuit. The second problem, lack of adequate acuity, cannot be corrected with any known circuit. More specifically, those with normal hearing can carry on a conversation at a signal-to-noise ratio (SNR) of 0 to −5 dB, meaning the noise may be as much as 5 dB more intense than the desired speech signal. Individuals with moderate-to-severe hearing loss, on the other hand, may often require an SNR of +5 to +10 dB, 10 dB greater than those with normal hearing. The impossibility of a circuit solution to the problem is seen, for example, by the fact that no circuit can know which of many voices at a party is noise and which is considered signal. It is well known that a listener can switch his or her attention at will from one talker to another at a noisy party, often while continuing to look at the original uninteresting talker. These and other considerations are discussed in more detail in an editorial "Hearing Aids: Past, Present, and Future," by Mead C. Killion, scheduled to appear in the May 1997 issue of the British Journal of Audiology.

The SNR problem has been most obvious with children having severe-to-profound hearing loss. Such children find it impossible to properly understand the teacher even when they wear the best conventional hearing aids in a typical classroom. The use of FM systems such as those currently available from manufacturers like Telex of Minnesota and others has provided a substantially improved SNR for such children, permitting them to learn and understand speech in classroom settings.

In FM systems, the teacher's voice (or other audio signal, perhaps from a video tape or audio recording) is used to frequency modulate a radio frequency carrier which is transmitted within the classroom. The students are then equipped with FM receivers. The FM receivers pick up the transmitted signal, demodulate it, and present received audio either to the students' hearing aids or to their ears via headphones or earphones. In this particular example, there is one audio signal, which is transmitted, that being the teacher's voice.

A severely hearing-impaired adult at a restaurant may face a similar difficulty with respect to noise, but now at least three talkers (assuming the case where two couples go out to eat) need to be heard. Passing a single microphone around is sometimes done as an effective, but inconvenient, solution. Similarly, head-worn hearing aids including FM receivers used with single-microphone FM transmitters are increasingly being used. One such effective system is manufactured by AVR Communications in Israel.

What is clearly needed, however, is a convenient multiple-microphone pickup system where each microphone operates in a wireless mode. Such a system would serve both those with hearing impairment and normally-hearing individuals, allowing both to communicate in difficult situations and environments. Such systems can be made small enough to also be used by individuals who wish to communicate discreetly with their undercover teammates.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for enhancing speech intelligibility using wireless communication, substantially as shown in and/or described in connection with at least one of the figures, as set forth more completely in the claims.

These and other features and advantages of the present invention may be appreciated from a review of the following detailed description of the present invention, along with the accompanying figures in which like reference numerals refer to like parts throughout.

DETAILED DESCRIPTION OF THE INVENTION

Aspects of the present invention relate generally to instrumentation commonly referred to as "assistive listening devices" and more particularly a method and system for the enhancement of speech intelligibility utilizing wireless communication. In an embodiment of the present invention, a group of talkers may have a microphone and a transmitter operating in combination with a receiver arranged to accept each of the transmitted signals and pass the combined signal on to hearing aids or earphones. The listener may thereby be provided with a relatively noise-free signal from each of the desired talkers.

A method and system for the enhancement of speech intelligibility utilizing wireless communication is provided. An embodiment of the method and system addresses the situation in which a listener or a group of listeners (who may or may not be hearing-impaired) may desire to comprehend the speech of one or more talkers in the presence of background noise or reverberation. An embodiment of the present invention may be particularly useful to hearing-impaired individuals, normal-hearing individuals who communicate in difficult and noisy environments, and individuals who wish to communicate discreetly.

An embodiment of the present invention may be implemented as a one-way communications system. For example, an embodiment of the present invention may be designed to aid a set of listeners in the comprehension of a set of talkers. Each talker may be equipped with a specific subsystem. The subsystem may be a microphone and a transmitting device, designated herein as a Talker unit. Each listener may also be equipped with a different specific subsystem. This subsystem may be a Receiver unit. In an embodiment of the present invention, an individual may be equipped as both a talker and a listener simultaneously, hence, permitting two or more hearing-impaired individuals to benefit from the system.

As mentioned hereinabove, an example of such a situation in which the present invention may be useful may be where a hearing-impaired individual may need to be part of a group discussion but is unable to participate due to the presence of noise or reverberation. In an embodiment of the present invention, the hearing-impaired person may equip each of the important talkers with a unit (a transmitter subsystem), which may transmit a spread-spectrum digital signal, and equip himself/herself with a different unit (a receiving subsystem), which may receive the combined signals from the equipped talkers. The individual, as a result, may be able to effectively conduct a meeting or a discussion. The receiving subsystem may be a spread-spectrum receiver with means that may appropriately receive and decode the digital signals.

Figure 1:
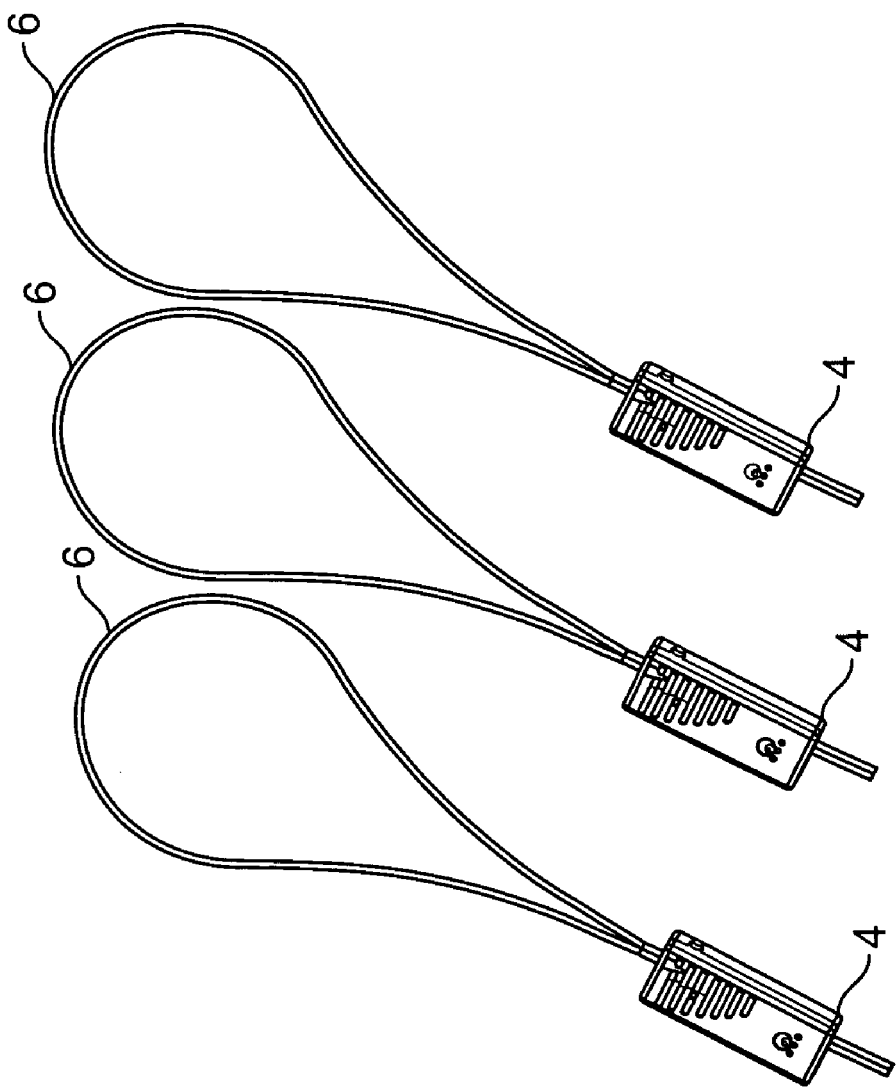
FIG. 1 illustrates exemplary Receiver and Talker units, in accordance with an embodiment of the present invention.
Figure 1:
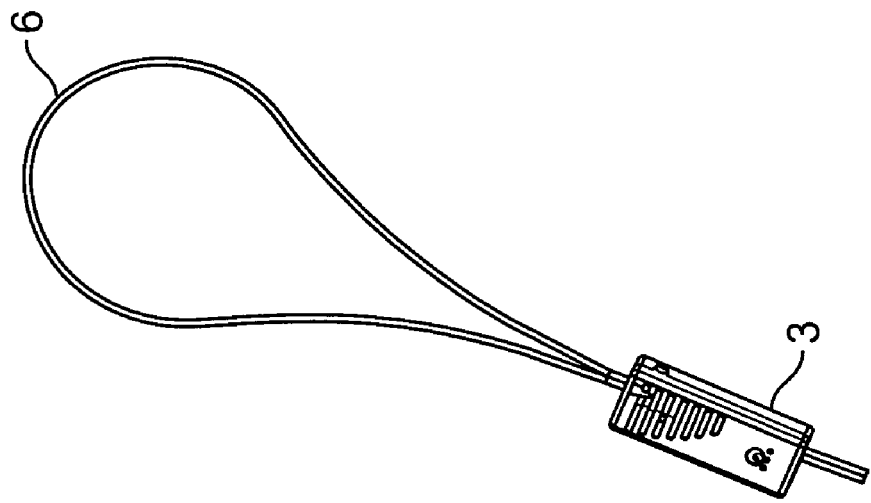

FIG. 1 illustrates exemplary Receiver and Talker units, in accordance with an embodiment of the present invention. Each of the Receiver unit 3 and the three Talker units 4 may be equipped with a lanyard 6 to support each unit on the body.

Figure 2:
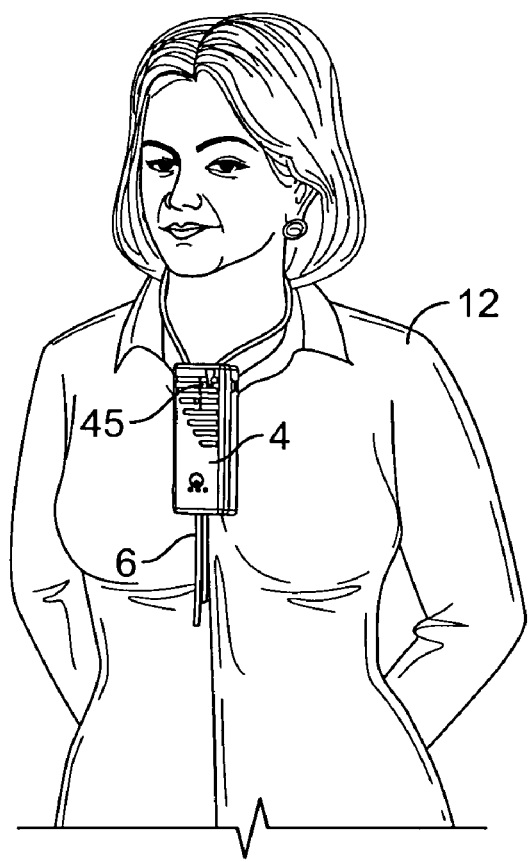
FIG. 2 illustrates a Talker unit supported around the neck of a talker, in accordance with an embodiment of the present invention.

FIG. 2 illustrates a Talker unit supported around the neck of a talker, in accordance with an embodiment of the present invention. The Talker unit 4 may be supported around the neck of the talker 12 with the lanyard 6. The lanyard 6 may be adjusted to bring the directional microphone 45 of unit 4 to within 4-5 inches of the mouth of talker 12.

Figure 3:
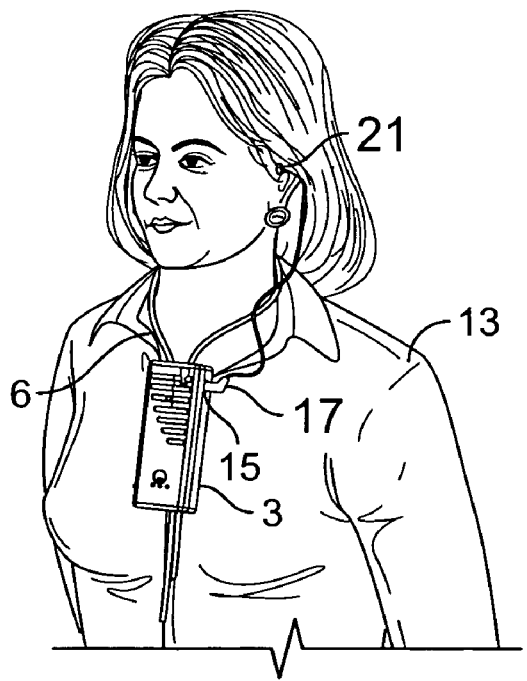
FIG. 3 illustrates a Receiver unit supported around the neck of a listener, in accordance with an embodiment of the present invention.

FIG. 3 illustrates a Receiver unit supported around the neck of a listener, in accordance with an embodiment of the present invention. The Receiver unit 3 may be supported around the neck of the listener 13 by lanyard 6 at a comfortable location. An earphone unit 21 may be connected to plug 17, which may be plugged into jack 15 on Receiver unit 3.

Figure 4A:
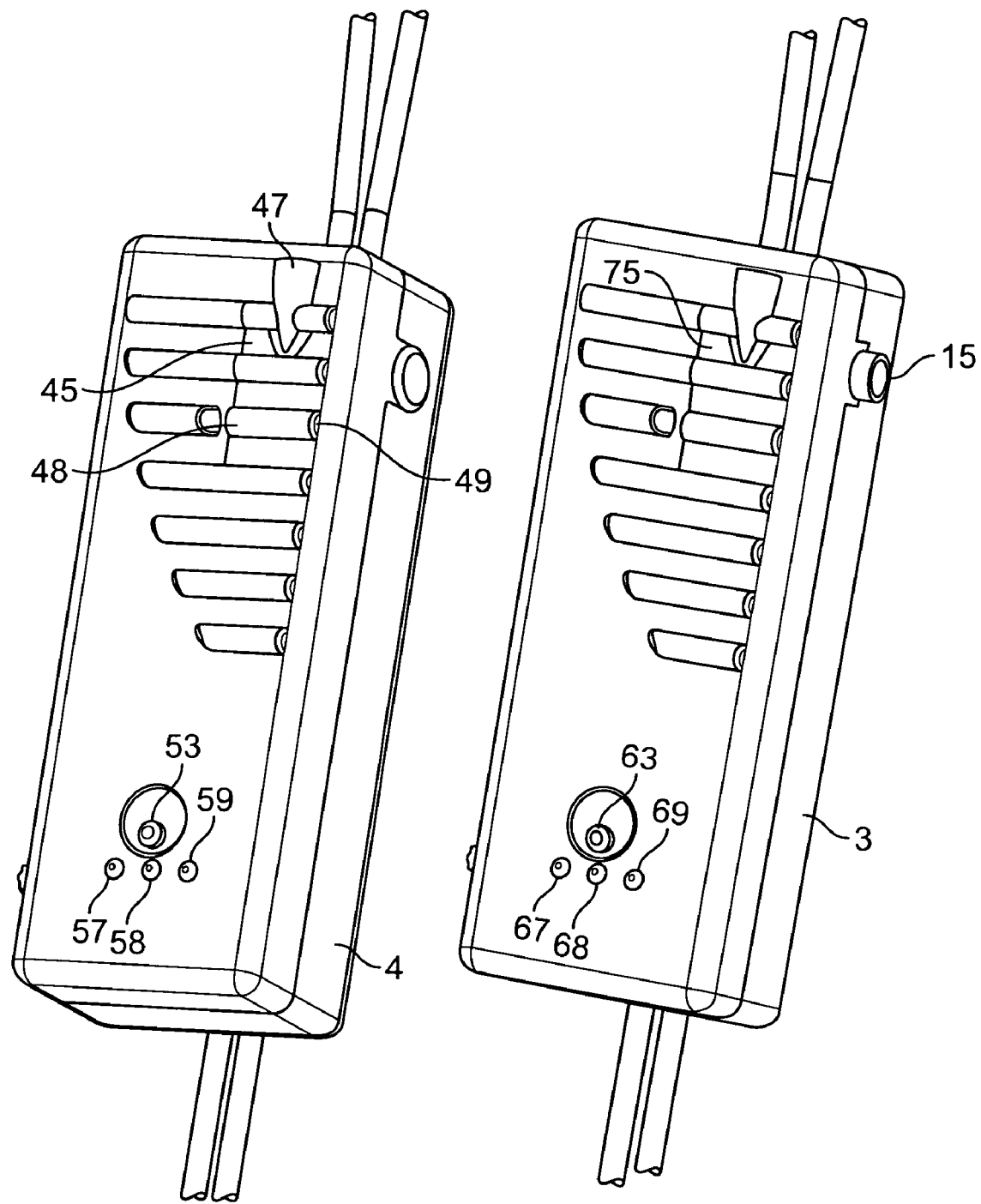
FIG. 4A illustrates an enlarged view of an exemplary Talker unit and Receiver unit, in accordance with an embodiment of the present invention.

FIG. 4A illustrates an enlarged view of an exemplary Talker unit and Receiver unit, in accordance with an embodiment of the present invention. Talker unit 4 may have a directional microphone 45 with front inlet 47 and rear inlets 48 and 49. An on-off switch 53 may activate the Talker unit 4 and lights 57, 58, and 59 may indicate the condition of the communication system. Receiver unit 3 may be similar in appearance to Talker unit 4, with microphone 75 allowing the user to monitor their own voice. Receiver unit 3 may contain an earphone jack 15 to which an earphone or inductive link may be plugged. An on-off switch 63 may activate the Receiver unit 3 and lights 67, 68, and 69 may indicate the condition of the communication system.

Figure 4B:
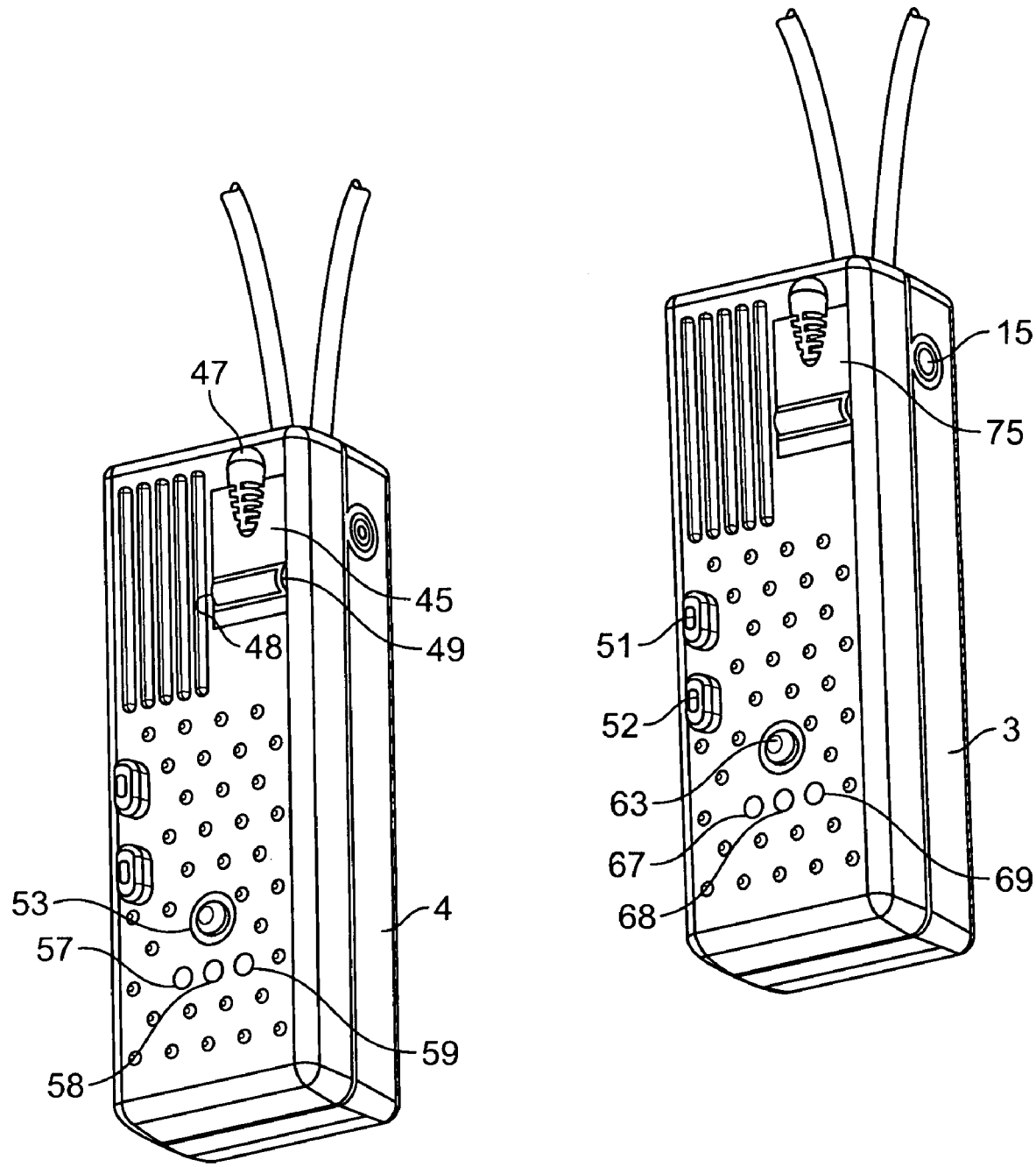
FIG. 4B illustrates an enlarged view of another exemplary Talker unit and Receiver unit, in accordance with an embodiment of the present invention.

FIG. 4B illustrates an enlarged view of another exemplary Talker unit and Receiver unit, in accordance with an embodiment of the present invention. Talker unit 4 may have a directional microphone 45 with front inlet 47 and rear inlets 48 and 49. An on-off switch 53 may activate the Talker unit 4 and lights 57, 58, and 59 may indicate the condition of the communication system. Receiver unit 3 may be similar in appearance to Talker unit 4, with microphone 75 allowing the user to monitor their own voice. Receiver unit 3 may contain an earphone jack 15 to which an earphone or inductive link may be plugged. An on-off switch 63 may activate the Receiver unit 3 and lights 67, 68, and 69 may indicate the condition of the communication system. A volume control comprising two momentary contact switches, 51 and 52, may adjust the earphone signal amplitude UP or DOWN, respectively.

Figure 5:
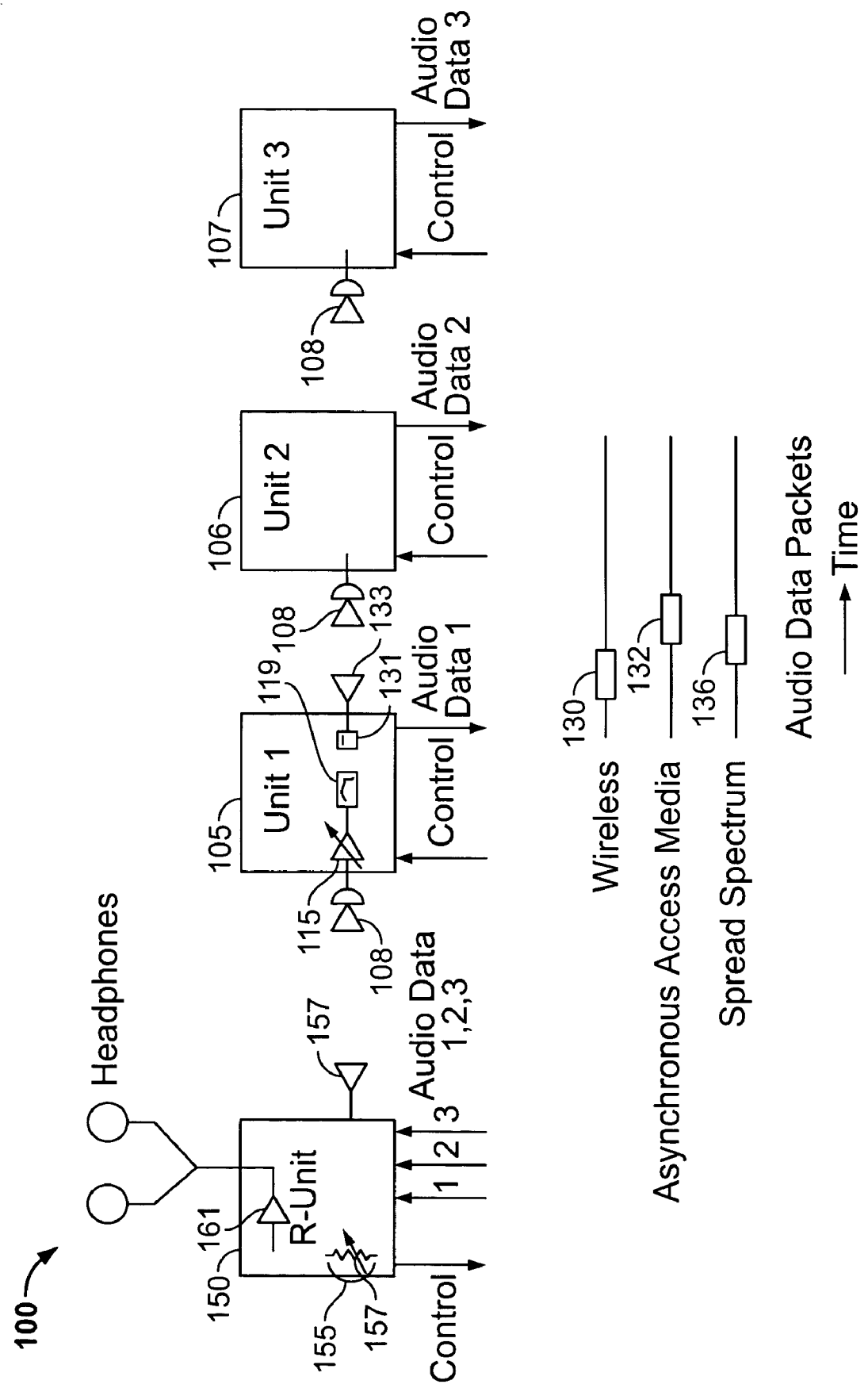
FIG. 5 illustrates a block diagram of an exemplary system for the enhancement of speech intelligibility utilizing wireless communication, in accordance with an embodiment of the present invention.

FIG. 5 illustrates a block diagram of an exemplary system for the enhancement of speech intelligibility utilizing wireless communication, in accordance with an embodiment of the present invention. The system 100 may comprise a plurality of Talker units 105, 106, and 107. The Talker units 105, 106, and 107 may be worn, carried, or attached to the talkers in a group, such that their attendant microphones may be located close to the mouth of each talker (for example, on a shirt collar). Talker units 105, 106, and 107, may be able to transmit audio data packets 130, 132, and 136, respectively, and receive control commands from Receiver unit 150. Each talker unit 105, 106, and 107 may be provided with a microphone 108. In an embodiment of the present invention, the microphone 108 may be a small electret microphone available from such sources as, for example, Sonion (in Denmark) or Knowles Electronics (in Illinois). The microphone 108 may be a directional microphone optimized for use on the chest or neck to provide an attenuation of background noise of 4-5 dB relative to an omnidirectional microphone.

Generally, the talker unit microphones are located at one-tenth the distance from the talker's mouth that the listener's hearing aid microphone would be, and as a result a single-microphone pickup may provide an increase of 20 dB in signal-to-noise ratio. The background noise at both locations may be about the same, but a speech utterance that produces a sound pressure level of 100 dB at the talker microphone on the chest of the talker may produce only around 80 dB at the listener's output device such as, for example, a hearing aid. Each of three talker units used in a system may pick up a portion of the background noise, and these portions may be uncorrelated. As a result, when all three microphones are active at one time, the total noise power summed at the receiver unit will be approximately three times that of a single microphone, or an increase of 4.8 dB over that of a single microphone. In an embodiment of the present invention, directional microphones may be used in each talker unit, which may result in reducing the noise at each microphone by 5 dB, and as a result the 20 dB improvement of a single microphone may be retained.

In an embodiment of the present invention, a directional microphone such as, for example, the directional microphone 45 of FIG. 4B may be specially tuned to maximize speech-to-noise receptivity at a torso-worn microphone in noisy environments. A unidirectional polar response microphone such as, for example, a Cardioid microphone (180 deg. Null) may be modified to balance the microphone's front and rear acoustic load/timing such that the null angle decreases to 140-160 degrees. This tuning may widen the null taking advantage of additional side rejection without losing sensitivity from the forward facing position. The external features of this embodiment of this directional microphone device may be identified in by elements 47, 48, and 49 of FIG. 4B.

In an embodiment of the present invention, the Talker units 105, 106, and/or 107 may be given to a group of talkers wherein each Talker unit may contain a spread-spectrum transmitter 131. The transmitter 131 may take a signal from a microphone 108 through a gain stage 115 and convert the analog microphone signal into linear PCM data packet, which may be transmitted via an antenna 133 to a Receiver unit 150. The transmission may be in the form of asynchronous data packets whose transmission timings may be directed by the Receiver unit 150 such as, for example, transmission done in Bluetooth®. A finite impulse response (FIR) filter 119 may adjust the frequency response of microphone 108 and perform anti-aliasing for the A/D converter. The Receiver unit 150 may contain a receiver, which may receive through an antenna 157 audio data packets 130, 132, and 136 from each Talker unit, and convert them back to linear PCM format and place them in a queue. Isochronously, the Receiver unit 150 may sum the data from the three Talker units.

Using spread spectrum transmission may allow multiple systems to be used within a physical space. The use of readily available, low-cost, Bluetooth®, Zigbee®, and other 2.4 GHz radio, for example, for Talker units 105, 106, and 107 and Receiver unit 150 may provide the ability to use small antennas at 2.4 GHz.

In an embodiment of the present invention, there may be a control path such that a Receiver unit may start and stop transmission of data. A Receiver unit may also send gain commands to change the microphone pre-amp gain as described hereinafter. In an embodiment of the present invention, the control path for data transmission may be a wireless data path.

In an embodiment of the present invention, the user's Receiver unit 150 may transmit information about the setting of the user's volume control 155 to each Talker unit 105, 106, and 107 in order to set the front-end gain of preamplifier 115 of each of the Talker units while also setting the gain of the user's speaker (headphone) amplifier 161. Thus, high microphone-circuit sensitivity may be provided when the sound levels are low, but the microphone-circuit sensitivity may be reduced when the sound levels are high enough so that overload would otherwise occur in the microphone circuit and/or A/D converter 219 of FIG. 6. Based on experimental results with different environmental loudness and hearing loss situations, the best result for each position of the volume control may be generated and incorporated into the design of the system.

In an embodiment of the present invention, the Receiver unit 150 may contain software that decodes the position of volume control 155 through an A/D converter. The volume control 155 may be a variable resistor controlled by wheel 157. The variable resistor may be part of a voltage divider that changes the voltage at the A/D converter. After allowing for hysteresis, the software may determine a range of separate steps for volume, for example, 16-32 separate steps. In an alternative embodiment of the present invention, the volume may be controlled by a digital volume control, where a user may press contacts to indicate whether the volume should go up and down. Hence, volume control may be obtained from two momentary contact switches (UP and DOWN), which provide the volume information to the Receiver unit 150. In such an embodiment, the volume control 155 and the wheel 157 may be replaced by two momentary contact switches.

Experimentation may be utilized to determine an optimal gain at the microphone and at the speaker (headphone) amplifier for an optimal signal-to-noise ratio. As the software recognizes the volume control has been changed, it may change the speaker amplifier gain and send messages to the Talker units to change their gains accordingly.

Figure 6:
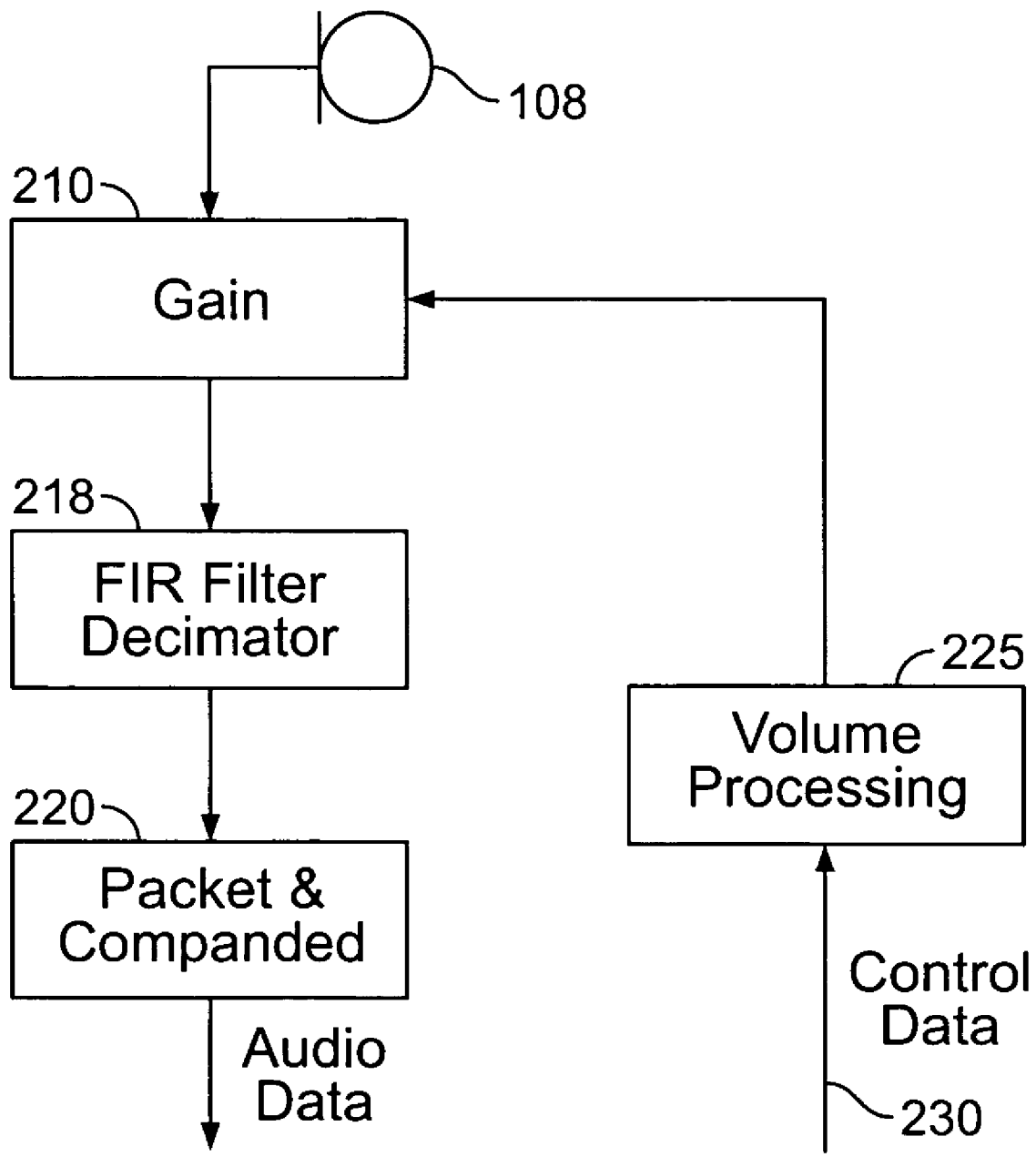
FIG. 6 illustrates a block diagram of an exemplary Talker unit, in accordance with an embodiment of the present invention.

FIG. 6 illustrates a block diagram of an exemplary Talker unit, in accordance with an embodiment of the present invention. A Talker unit may comprise a variable gain microphone amplifier 210 that may be controlled by a signal produced by a digital receiver 225 where volume processing may occur. The digital receiver 225 may be controlled by volume control signal 230. The variable gain microphone amplifier may be connected to the Talker unit microphone 108. After going through the amplifier 210, the digital signal may go through a FIR filter and decimator 219, which may include, for example, the FIR filter 119 of FIG. 5. After the FIR filter and decimator 219 the digital signal may be fed to subsystem 220, which may compress the data into compounded digital packets such as, for example, packets 130, 132, and 136 of FIG. 5.

In an embodiment of the present invention, a Receiver unit may determine the audio power in each of data packets 130, 132, and 136, and assign, for example, unity gain to the channel with the highest power and a 6 dB loss to the other two. Experiments have shown that this method provides an additional 3 dB signal-to-noise ratio over fixed-gain processing, while avoiding the audible artifacts of most gain-switching devices. The summed signal may then be sent through an FIR filter to remove any aliasing and to generate the proper sample rate for the D/A. In an embodiment of the present invention, the packet period may be of short duration, on the order of, for example, 10 mS. As a result, the switching transient may be made practically inaudible. Additionally, the switching period may be made equal to the period represented by the packet, which may be, for example, around 8.75 mS. A very simple decision algorithm comprising a sequence of steps to decide which Talker unit may have the highest audio power, may be employed. The switching may, therefore, be done on instantaneous basis. In another embodiment of the present invention, smoothly shaped attenuation such as, for example, a Gaussian shaped attenuation, may be utilized for switching, and as a result may more substantially reduce any residual noise that may be introduced by the switching process.

The local microphone on the Receiver unit may be summed at a loss such as 12 dB to this result to provide an audible "sidetone" signal to the wearer without significantly increasing the noise level at the output.

Figure 7:
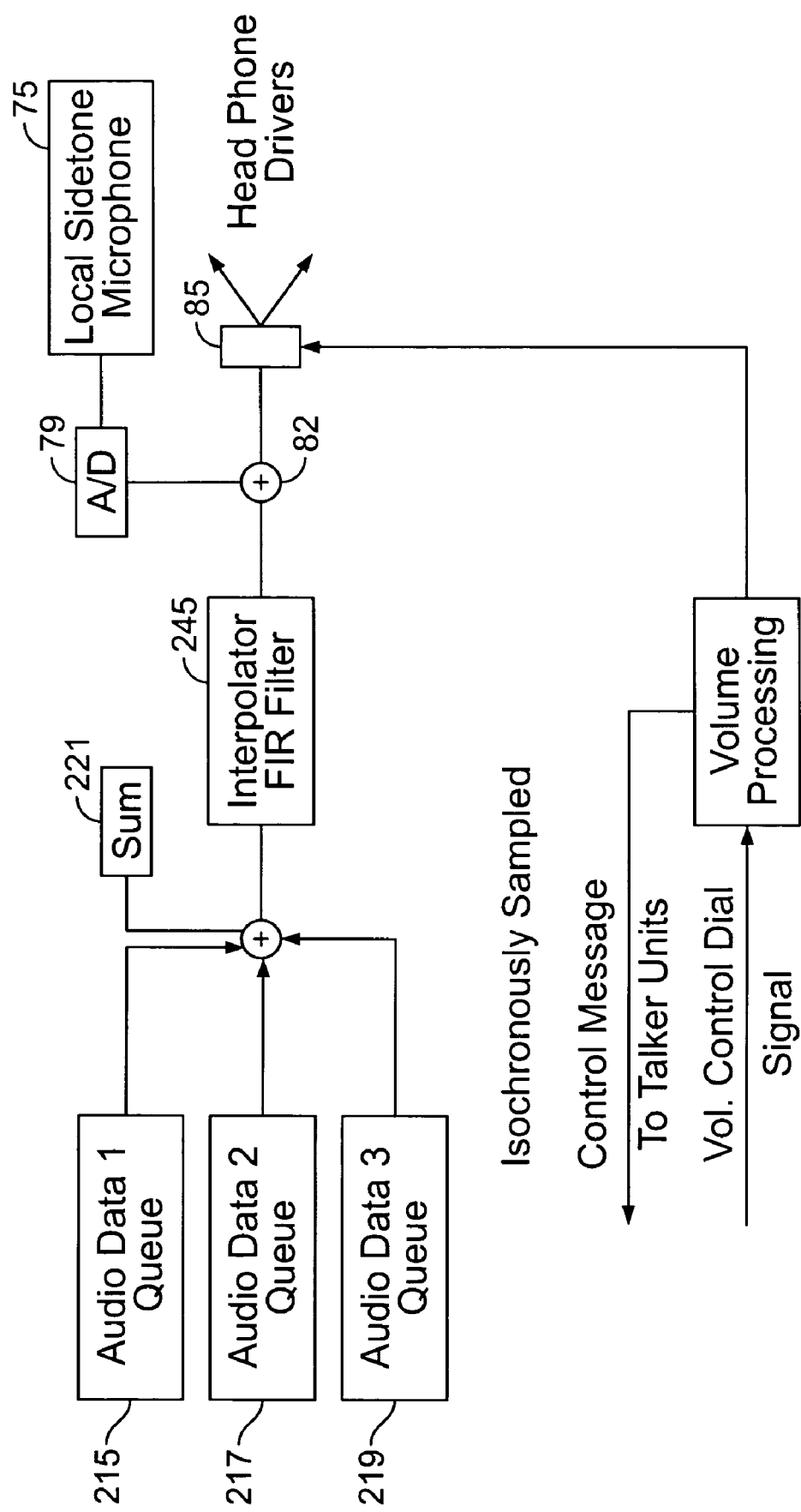
FIG. 7 illustrates a block diagram on an exemplary Receiver unit, in accordance with an embodiment of the present invention.

FIG. 7 illustrates a block diagram on an exemplary Receiver unit, in accordance with an embodiment of the present invention. Audio data packets such as, for example, the audio data packets 130, 132, and 136 of FIG. 5 may be generated by the Talker units and transmitted asynchronously. The audio data packets may be received asynchronously by the Receiver unit, where they may be held in individual buffers 215, 217, 219 in the Receiver unit until, at the digital sample rate, the individual samples in the audio data packets are combined in digital summer 221 and passed on to the interpolator FIR filter 245. A/D converter 79 may then convert the analog output of the local sidetone microphone 75. The output of converter 79 may be combined in digital summer 82 with the combined output of the signals from the three Talker units. The signal from the local sidetone microphone 75 may be combined at a level reduction such as 12 dB such that it does not contribute to the overall noise level. In an embodiment of the present invention, the Receiver unit may determine the audio power in each of data packets 130, 132, and 136, and assign, for example, unity gain to the channel with the highest power and a 6 dB loss to the other two before buffering the packets. Alternatively, the digital summer 221 may apply the gains associated with the packets prior to combining the packets. The losses may be applied to the same packets as those used in making the gain decision.

Typically, a HV3-mode Bluetooth® protocol uses a single packet per audio channel sent isochronously within a 625 uS (micro-second) time slot to transmit the information that is decoded on reception into 3.75 mS of audio. Because of preambles, controller information and error checking and other overhead, the total number of bits that can be transmitted in the time slot described above is 240 bits. The resulting distortion and loss of speech information may be high. In an embodiment of the present invention, this loss may be circumvented while maintaining an efficient use of the basic Bluetooth® A/D converter hardware. In order to transmit additional digital data, the asynchronous data communication allowed by Bluetooth® may be changed to allow expanding each channel's packet to use three 625 uS time slots. For example, 1400 bits may be transmitted per packet, which may provide 8.75 mS of audio. As a result, 2.5 times the number of bits per second of audio can be transmitted, sufficient information to increase the audio bandwidth more than twofold, from 3.5 kHz to 7.5 kHz, and simultaneously increase the information content sufficiently to decrease the distortion caused by the data compression so that the transmitted intelligibility in noise may be comparable to a system with no distortion.

Since both ends of the communication link may be controlled, the quality and service of the transmitted signals may also be controlled, even with asynchronous communication. For example, to obtain the highest quality, the A/D and D/A rates must be exactly synchronized, which may require that the codec clocks be synchronized. Because the Bluetooth® protocol already requires radio clock synchronization between the communicating units, a synchronized radio clock may be used as the basis for the codec clock in the system, hence, ensuring packet uniformity. Aspects of the present invention may not be restricted to Bluetooth® architecture, and may apply to a broad range of digital-RF circuits.

In an embodiment of the present invention, two Receiver units, each of which may incorporate an audio output, may be used, where one may be programmed to operate as a master unit and the other may be programmed to operate as a slave unit. In such an embodiment, it may be possible to make a simple "walkie-talkie" pair. The Receiver units may have their microphones activated to allow operation as audio transceivers, and the volume control function may be modified to maintain constant side-tone level as the talker's sensitivity is controlled by the listener, as described hereinabove.

Figure 8:
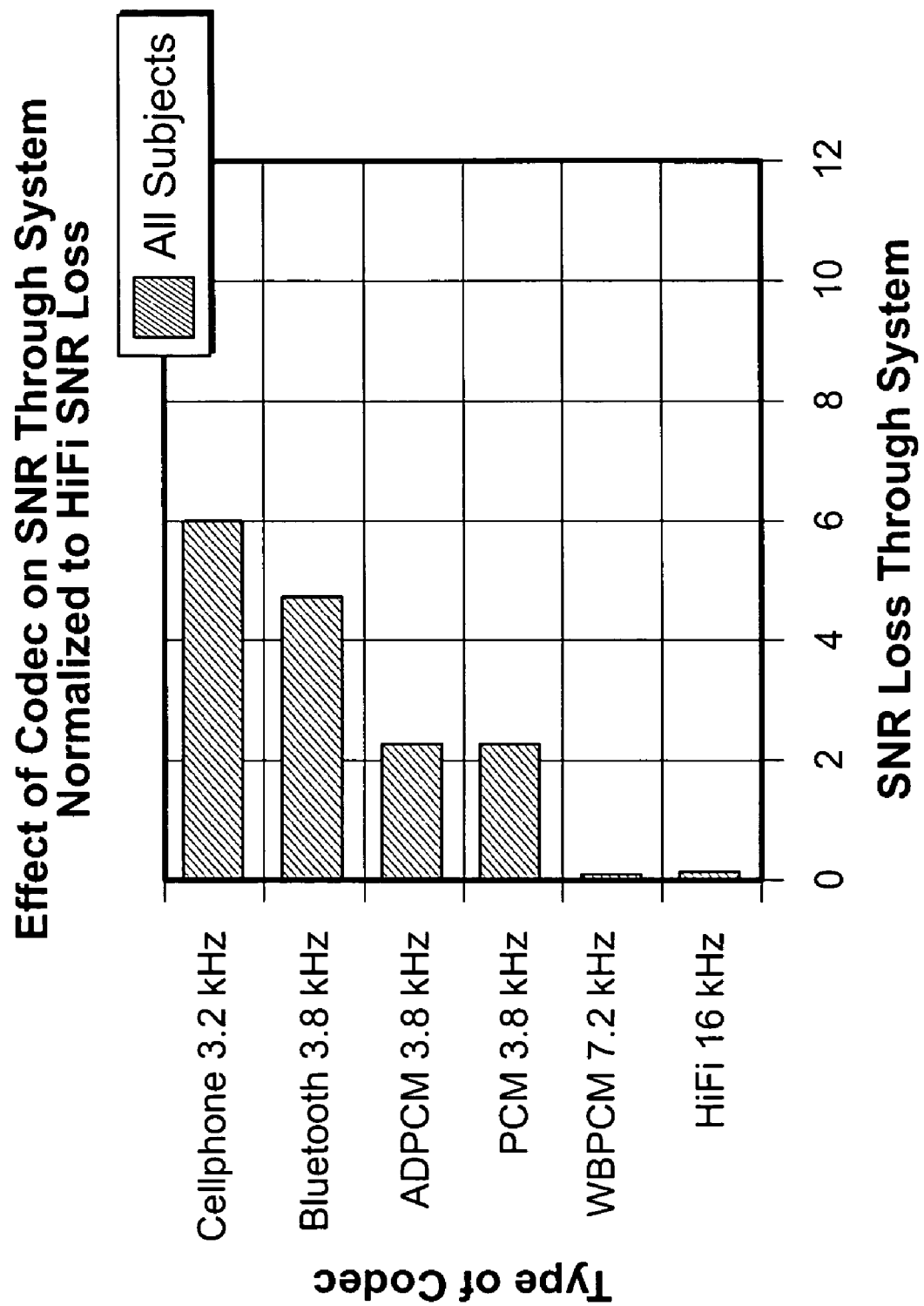
FIG. 8 illustrates an exemplary intelligibility plot in noise data obtained during the course of psychoacoustic experiments to optimize performance, in accordance with an embodiment of the present invention.

FIG. 8 illustrates an exemplary intelligibility plot in noise data obtained during the course of psychoacoustic experiments to optimize performance, in accordance with an embodiment of the present invention. Generally, cell phone and Bluetooth® transmissions have limited bandwidth of less than 4 kHz and relatively high distortion. When compared to a direct high-fidelity wired connection, the cell phone and Bluetooth® transmissions took 5-6 dB greater signal-to-noise ratio to be understood. The main purpose was to increase the effective SNR at the user's ear; therefore, use of cell phone and Bluetooth® transmissions would at the outset throw away 5 dB. A practical packet-switched data scheme was devised with a 10 kHz Nyquist bandwidth and a measured 7.8 kHz bandwidth after the FIR filtering. An embodiment of the present invention, in the course of experimentation, gave intelligibility comparable to a hard-wired connection.

In an embodiment of the present invention, a Talker unit may be a radio transceiver, with transmitting and receiving capabilities. Similarly, a Receiver unit may be also a radio transceiver with transmitting and receiving capabilities. It should be noted, that the use of the terms transmitter and receiver hereinabove, in association with Talker and Receiver units is for purposes of illustration and emphasis of functionality. All units as described hereinabove may comprise transceivers and have transmitting and receiving capabilities.

While the above discussion examines a system comprising three Talker units and one Receiver unit, it should be understood that systems in accordance with the present invention may comprise at least one Talker unit and at least one Receiver unit. The set up of a system in accordance with an embodiment of the present invention is not limited to the exemplary number of units used throughout the discussion.

To this end, a method for enhancing speech intelligibility utilizing wireless communication is provided. In an embodiment of the present invention, the method may involve providing a Receiver unit to at least one listener and a Talker unit to each of a plurality of talkers. Each Talker unit may be capable of transmitting a wireless audio signal in the form of data packets and receiving a wireless control signal from a Receiver unit. The wireless audio data signals may then be demodulated into audio signals. The audio signals may be mixed to form a mixed output signal and the resulting output signal may be delivered to earphones worn by the listener or to a inductive coil whose output is picked by a telecoil in a hearing aid worn by the listener.

Figure 9:
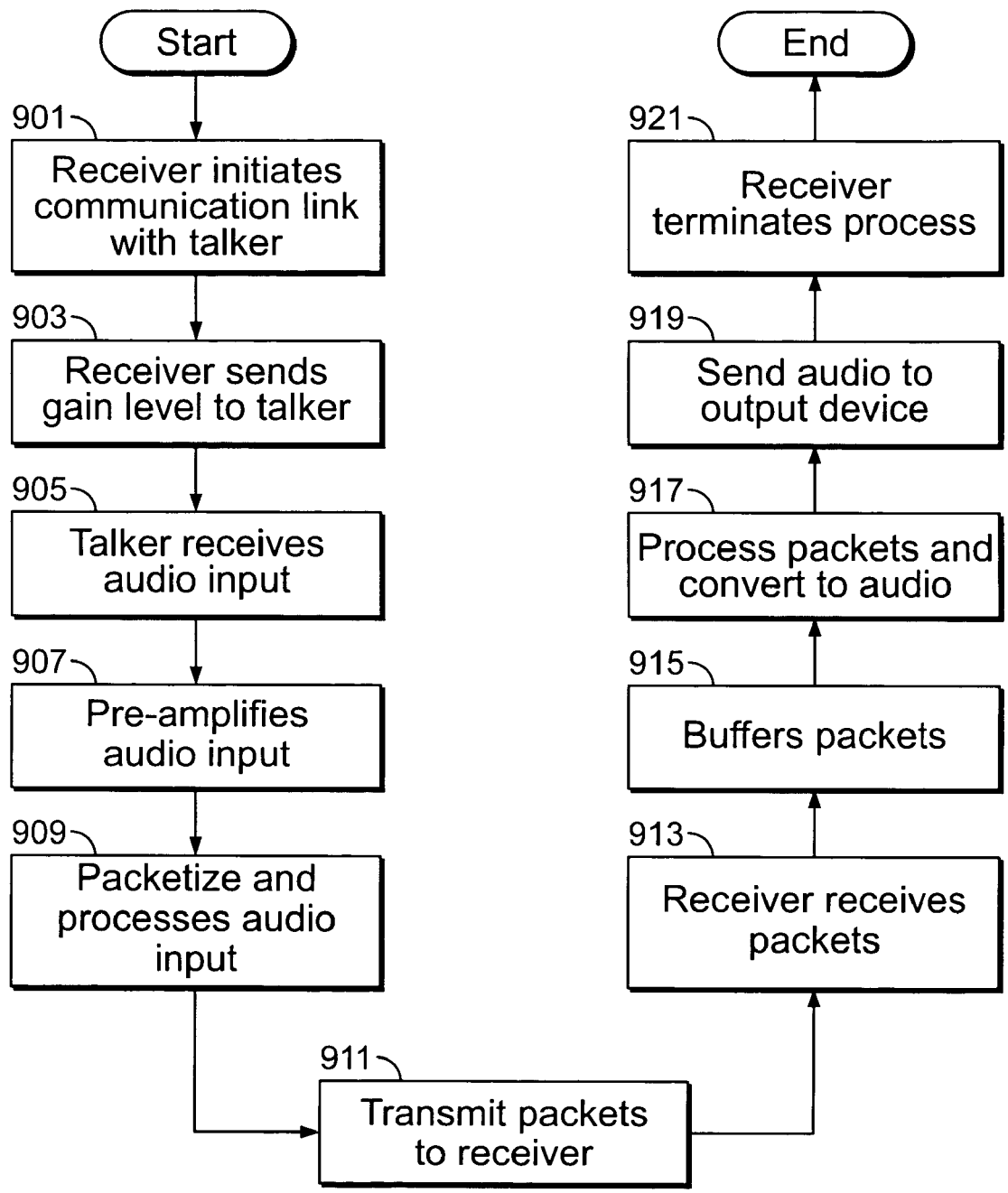
FIG. 9 illustrates a flow diagram of an exemplary method of operation a system, in accordance with an embodiment of the present invention.

FIG. 9 illustrates a flow diagram of an exemplary method of operation of a system, in accordance with an embodiment of the present invention. At an initial step 901, a Receiver unit may initiate a communication link with one or a plurality of Talker units. At a next step 903, the Receiver unit may communicate to the Talker unit(s) a gain level corresponding to a selected gain level by the user of the Receiver unit. The gain level may be used by the Talker unit(s) as a pre-amplification for signals communicated by the Talker unit(s) to the Receiver unit. At a next step 905 a Talker unit may receive an audio input from a user of the Talker unit. The audio signal may then be pre-amplified by the Talker unit using the gain level received from the Receiver unit, at a next step 907. The audio signal may then be processed and packetized into digital audio packets at a next step 909. The digital audio packets may then be transmitted to the Receiver unit at a next step 911. The Receiver unit may then receive the transmitted digital audio packets at a next step 913. The received digital audio packets may then be buffered at a next step 915 in the Receiver unit. At a next step 917, the buffered digital audio packets may be combined, processed, and converted to an audio signal. At a next step 919, the audio signal may be sent to an output device, such as, for example, a hearing aid, a speaker, headphone or earphone, to be played to the user of the Receiver unit. The process may terminate at step 921, which may be signaled by the Receiver unit.

Accordingly, the present invention may be realized in hardware, software, or a combination thereof. The present invention may be realized in a centralized fashion in at least one computer system, or in a distributed fashion where different elements may be spread across several interconnected computer systems. Any kind of computer system or other apparatus adapted for carrying out the methods described herein may be suited. A typical combination of hardware and software may be a general-purpose computer system with a computer program that, when being loaded and executed, may control the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for enhancing speech intelligibility using wireless communication, the method comprising:
    communicating, by at least one receiver unit, to at least one talker unit, a gain level for pre-amplification of wireless signals transmitted from the at least one talker unit to the at least one receiver unit;
    transmitting, by the at least one talker unit, digital audio packets via a wireless signal; and
    receiving, by the at least one receiver unit, the transmitted wireless signal.

2. The method according to claim 1 wherein the at least one receiver unit controls the initiation and termination of the communication between the at least one receiver unit and the at least one talker unit.

3. The method according to claim 1 further comprising selecting a speaker gain level, wherein the gain level corresponds to the selected speaker gain level.

4. The method according to claim 1 wherein prior to transmitting the digital audio packets, the method further comprises:
    receiving an audio signal by the at least one talker unit from a user of the at least one talker unit;
    pre-amplifying the received audio signal with the gain level communicated by the at least one receiver unit;
    filtering the audio signal to a frequency compatible with a utilized communication channel and a utilized communication protocol; and
    compressing the audio signal into a digital audio packet.

5. The method according to claim 4 wherein the utilized communication protocol comprises a Bluetooth® communication protocol.

6. The method according to claim 1 wherein after receiving the transmitted wireless signal by the at least one receiver unit, the method further comprises:
    buffering the digital audio packets contained in the wireless signal;
    combining the digital audio packets;
    filtering the combined digital audio packets;
    converting the filtered combined digital audio packets to an audio signal; and
    sending the audio signal to a speaker device at a volume level desired by the user of the at least one receiver device.

7. The method according to claim 6 wherein the volume level comprises a setting of a volume control.

8. The method according to claim 7 wherein the volume control comprises a variable resistor controlled by a wheel.

9. The method according to claim 7 wherein the volume control comprises two momentary contact switches.

10. The method according to claim 6 wherein the speaker device comprises a speaker connected to the at least one receiver unit.

11. The method according to claim 6 wherein the speaker device comprises headphones connected to the at least one receiver unit.

12. A system for enhancing speech intelligibility using wireless communication, the system comprising:
    at least one talker unit having a microphone and a transceiver, capable of transmitting digital audio packets via a wireless signal; and
    at least one receiver unit having a transceiver, capable of receiving the transmitted wireless signal; wherein the at least one receiver unit communicates to the at least one talker unit a gain level for pre-amplification of the wireless signal.

13. The system according to claim 12 wherein the at least one receiver unit controls the initiation and termination of the communication between the at least one receiver unit and the at least one talker unit.

14. The system according to claim 12 wherein the at least one talker unit comprises:
    circuitry capable of receiving an audio signal from a user of the at least one talker unit;
    a pre-amplifier that pre-amplifies the received audio signal with the gain level communicated by the at least one receiver unit;
    a processing circuitry capable of filtering the audio signal to a frequency compatible with a utilized communication channel and a utilized communication protocol; and
    a compressor that packetizes the audio signal into a digital audio packet.

15. The system according to claim 12 wherein the at least one receiver unit comprises:
    buffers that hold the digital audio packets contained in the wireless signal;
    an adder that combines the digital audio packets;

a processing circuitry that filters the combined digital audio packets;

circuitry capable of converting the filtered combined digital audio packets to an audio signal; and an output circuitry that sends the audio signal to a speaker device at a volume level desired by the user of the at least one receiver unit.

16. The system according to 15 wherein the volume level comprises a setting of a volume control.

17. The system according to claim 16 wherein the volume control comprises a variable resistor controlled by a wheel.

18. The system according to claim 16 wherein the volume control comprises two momentary contact switches.

19. The system according to claim 15 wherein the speaker device comprises a speaker connected to the at least one receiver unit.

20. The system according to claim 15 wherein the speaker device comprises headphones connected to the at least one receiver unit.

21. The system according to claim 12 wherein the microphone comprises a directional microphone.

22. The system according to claim 12 further comprising:
the at least one receiver unit capable of functioning as a talker unit; and
the at least one talker unit capable of functioning as a receiver unit.

23. A method for enhancing speech intelligibility using wireless communication, the method comprising:
determining, by at least one receiver unit, a gain level;
communicating, by the at least one receiver unit, to a plurality of talker units, the gain level for pre-amplification of wireless signals transmitted from the plurality of talker units to the at least one receiver unit;
transmitting, by the plurality of talker units, digital audio packets via a wireless signal;
receiving, by the at least one receiver unit, the transmitted wireless signal; and
wherein, the at least one receiver unit controls the initiation and termination of the communication between the at least one receiver unit and the plurality of talker units.

24. The method according to claim 23 determining the gain level comprises:
determining, by the at least one receiver unit an audio power associated with each of the plurality of talker units;
assigning a unity gain level to a talker unit with the highest audio power; and
assigning a gain level with loss to the other talker units of the plurality of talker units.

25. The method according to claim 24 wherein the loss comprises a 6 dB loss.

26. A method for enhancing speech intelligibility using wireless communication, the method comprising:
communicating, by at least one receiver unit, to a plurality of talker units;
transmitting, by the plurality of talker units, digital audio packets via a wireless signal;
receiving, by the at least one receiver unit, the transmitted wireless signal;
determining, by the at least one receiver unit an audio power associated with each of the plurality of talker units based on the digital audio packets received from the plurality of talker units;
assigning a unity gain level to a talker unit with the highest audio power; and
assigning a gain level with loss to the other talker units of the plurality of talker units.

27. The method according to claim 26 wherein the at least one receiver unit controls the initiation and termination of the communication between the at least one receiver unit and the plurality of talker units.

28. The method according to claim 26 further comprising:
communicating the assigned gain levels to the associated talker units; and
utilizing, by the plurality of talker units, the associated gain levels for pre-amplification of signals communicated by the talker units to the at least one receiver unit.

29. The method according to claim 26 further comprising applying, at the plurality of talker units, the gain levels to the digital audio packets utilized in determining the gain levels.

* * * * *